United States Patent
Sachdeva et al.

(10) Patent No.: US 8,608,869 B2
(45) Date of Patent: Dec. 17, 2013

(54) SURFACE TREATMENT OF MAGNESIUM ALLOY CASTINGS FOR CORROSION PROTECTION

(75) Inventors: Deepika Sachdeva, Bangalore (IN); Arun M. Kumar, Bangalore (IN); Guangling Song, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 363 days.

(21) Appl. No.: 12/969,710

(22) Filed: Dec. 16, 2010

(65) Prior Publication Data
US 2012/0152409 A1 Jun. 21, 2012

(51) Int. Cl.
*C23C 22/57* (2006.01)
*C23C 22/48* (2006.01)
*C25D 11/02* (2006.01)
C23C 22/00 (2006.01)
C25D 11/20 (2006.01)
C22C 23/02 (2006.01)

(52) U.S. Cl.
USPC ............ 148/275; 148/243; 205/106; 205/321

(58) Field of Classification Search
USPC ........... 148/243, 275; 205/106, 321; 420/402, 420/407
See application file for complete search history.

(56) References Cited

U.S. PATENT DOCUMENTS

| | | | | |
|---|---|---|---|---|
| 2,881,514 | A | * | 4/1959 | Drummond .................. 428/649 |
| 4,978,432 | A | * | 12/1990 | Schmeling et al. ........... 205/108 |
| 2002/0060062 | A1 | * | 5/2002 | Nishikawa et al. ........... 164/428 |

OTHER PUBLICATIONS

Song et al., Corrosion Resistance of Aged Die Cast Magnesium Alloy AZ91D, Materials Science and Engineering A366 (2004) 74-86.*

* cited by examiner

*Primary Examiner* — Lois Zheng
(74) *Attorney, Agent, or Firm* — Reising Ethington, P.C.

(57) ABSTRACT

A method is disclosed for improving the corrosion behavior of cast magnesium alloy articles in which the magnesium alloy comprises an average composition of more than about 5 per cent by weight of aluminum. A microstructure with regions of varying aluminum content is developed during solidification. The microstructure comprises magnesium-rich grains generally surrounded by an aluminum-enriched phase on the boundaries between adjacent grains. The magnesium-rich grain interiors are then selectively chemically or electrochemically attacked to leave a more corrosion resistant aluminum-enriched surface on the articles. The corrosion resistance of the articles may be further enhanced by one or more of anodizing, aluminizing or painting the corrosion-resistant aluminum-enriched surface.

20 Claims, 3 Drawing Sheets

SURFACE TREATMENT OF MAGNESIUM ALLOY CASTINGS FOR CORROSION PROTECTION

TECHNICAL FIELD

This invention pertains to methods and processes for treating the surface of aluminum-containing, magnesium-based alloy castings to improve their corrosion resistance.

BACKGROUND OF THE INVENTION

One approach adopted by motor vehicle manufacturers to reduce vehicle mass is to employ light metal castings. These castings are typically fabricated of aluminum or magnesium, with magnesium being favored due to its lower density.

Some of the commonly used magnesium-based alloys in automotive cast applications are identified as AM20, AM50, AM60, AZ31, AZ80, AZ91, AE42 and AE44. The designations A, M, Z, and E refer to major alloying elements in the magnesium alloy: aluminum (A), manganese (M), zinc (Z) and rare earth (E) and the numerical designations identify the nominal concentration of each element in weight percent. Hence all of these magnesium alloys contain aluminum as a significant alloying element in nominal proportion ranging from 2 to 9 weight percent.

But all of these alloys are prone to corrode in aqueous environments. Hence most of these cast magnesium alloys have been applied on components such as steering column components, instrument panel beams, clutch and brake pedal brackets, transmission cases and housings, among others, where no exposure to corrosive media is anticipated or any exposure may be well controlled. A broader range of applications may be anticipated if the corrosion performance of articles cast from such magnesium alloys may be improved.

SUMMARY OF THE INVENTION

Casting, the solidification of liquid metal in a mold to form useful solid articles of specified geometry, is a widely-used process for manufacture of automotive components. It finds particular application for magnesium alloys, particularly magnesium alloys containing up to 9 percent by weight of aluminum, and leads, in the cast solid, to a microstructure of abutting, magnesium-rich grains separated by grain boundaries.

In most casting alloys, including magnesium-aluminum alloys, the alloying elements completely dissolve in the liquid metal to form solutions of uniform composition. During solidification, however, the alloying elements may partition themselves between the freezing liquid and the forming solid and promote a non-uniform distribution of alloying elements in the cast solid. The extent and nature of such partitioning is often influenced by the cooling rate of the casting, and, because different casting processes result in different cooling rates, by the specific casting process used.

For example in cast magnesium-aluminum alloys, significant aluminum enrichment of material located at the grain boundaries between magnesium-rich alpha phase grains may occur during solidification. Such grain boundary enrichment with aluminum is particularly prevalent during rapid cooling like that experienced by die castings, but may also occur, to a lesser extent, under slower cooling rates including those commonly experienced by sand castings. Both of these processes, among others, are used in the fabrication of cast magnesium articles.

The incidence and extent of this grain boundary enrichment by aluminum depends both on the concentration of aluminum and the specifics of the casting process. For example, in magnesium-based alloys with aluminum alloys of less than about 2 percent by weight, like AM20, such segregation is minimal under any casting process. In die-cast magnesium-based alloys with aluminum contents of exceeding about 5 weight percent, for example AM50 and AM60, or in sand-cast magnesium-based alloys with aluminum contents exceeding about 8 weight percent, for example AZ80 and AZ91, the aluminum enrichment during solidification may be appreciable. This appreciable aluminum enrichment may be sufficient to promote the formation of an aluminum-enriched beta phase (based, for example, on $Mg_{17}Al_{12}$), and the beta phase may form as a near-continuous network or framework surrounding magnesium-rich alpha phase grains. A like structure will also form on the surface of the casting. The magnesium-rich alpha phase has a more negative electrochemical potential, than the aluminum-enriched beta phase. And so, if the as-cast surface is reacted with a suitable medium, typically an aqueous solution, more of the magnesium in the alpha phase grains will be affected than the aluminum-enriched beta phase boundary material. The reacted magnesium-rich material from the alpha phase grains may be removed from the surface of the casting to leave cavities where the affected alpha grains had been located.

The reacted surface of the article will thus comprise substantially a network of beta phase material, and incorporate multiple cavities complementary to the former alpha grains to create a roughened, irregular surface. The reacted surface, which may incorporate some magnesium-based reaction products, typically magnesium-rich salts, is more corrosion-resistant than the original as-cast surface. The corrosion resistance of the reacted surface may be further enhanced by removal of any reaction products remaining on the surface. This may be accomplished with chemical cleaning, which preferentially dissolves away the magnesium-based reaction products from the surface. Such chemical cleaning may be accomplished by a brief immersion of the casting in a chromic acid based cleaning solution, followed by washing in distilled water and alcohol.

In a first embodiment, reaction with the as-cast surface and selective removal of the magnesium-rich alpha phase may be achieved by, medium-term, say, between 3 and 30 day, room temperature, or about 25° C., exposure to a reactive medium, such as a 1.6% (by weight) aqueous NaCl solution. In an aspect of the first embodiment an electrochemical method may be used to more rapidly selectively remove the magnesium-rich alpha phase. In this case a potential intermediate between the corrosion potentials of the alpha and beta phases is applied to a cast magnesium article in a suitable electrolyte. As a result the alpha phase will be attacked while the beta phase will be substantially unaffected to again promote a substantially aluminum-based beta phase-rich surface on the article. A suitable electrochemical procedure may employ a 0.5 N $Na_2SO_4$ solution with a pH of 6.6 at about room temperature, say in the range of 20-25° C., and require maintaining the alloy at a potential of about −1.35 volts, relative to a standard calomel electrode, for a period of between 8 and 15 hours:

The depth of reaction (or the extent of selective removal of alpha phase) may be determined by consideration of the size of the alpha, magnesium-rich grains. The desired outcome of the reaction process is to selectively attack these alpha grains to expose the substantially-continuous beta phase. Hence reaction must continue until the surface is removed to a depth of at least one grain dimension. Preferably the reaction depth will range from between 1 to 5 grain dimensions or less than about 200 µm. Again, the surface may be chemically cleaned of any reaction products after reaction has proceeded to a suitable depth.

The resulting clean, aluminum-enriched surface offers superior corrosion resistance relative to the as-cast surface composition. Yet further enhancement of corrosion performance may be achieved by further treating or modifying the surface.

In a second embodiment, the aluminum-enriched surface may be anodized. A preferred technique, due to the relatively high magnesium content of the aluminum-enriched beta phase is Plasma Electrolytic Oxidation or PEO. In the PEO process, a generally-conventional, anodically-grown oxide film is modified by the application of an electric field greater than the dielectric breakdown field for the oxide. Application of the electric field induces electrical discharges and promotes sintering and annealing of the anodized coating.

In a third embodiment the surface may be aluminized by deposition of aluminum. Due to the similarity in melting points of magnesium (650° C.) and aluminum (660° C.) deposition will generally employ a spray deposition process or a vapor-deposition process, conducted under at least partial vacuum which may, like the Ion Vapor Deposition process, be plasma-assisted.

In a fourth embodiment the surface may be painted. The roughened surface and the protruding beta walls will mechanically interfere with the paint film and enhance paint adhesion. The paint film is preferably 100 to 130 micrometers thick. A baked paint finish, as is commonly employed for automotive applications, generally offers superior performance to cold cured paint formulations. The enriched aluminum surface may render the magnesium aluminum article compatible with phosphate systems in common use for application of phosphate layer on vehicle bodies with steel and aluminum components. The anodized or aluminized surfaces developed in the prior embodiments would also be compatible with current phosphating practice.

The continuity of the aluminum-enriched surface depends both on the average aluminum content of the alloy and on the rate of cooling, which will influence the extent of aluminum segregation which occurs on solidification. For sand cast articles, which experience a relatively slow cooling rate, for example, a continuous aluminum-enriched surface layer may be developed in alloys with aluminum contents of about 8-9 weight percent or greater, such as AZ80 and AZ91. But a similarly continuous layer might develop in a 5-6 weight percent aluminum alloy such as AM50 or AM60 only when high pressure die cast, a process well known to promote rapid cooling.

Other objects and advantages of the invention will be apparent from a description of preferred embodiments which follows in this specification.

DESCRIPTION OF PREFERRED EMBODIMENTS

Magnesium castings, many of which are alloyed with aluminum, may offer attractive possibilities for reduction of vehicle mass due, primarily, to the very low density of magnesium. However magnesium is chemically active and prone to corrode if exposed to aqueous electrolytes, particularly when in electrical contact with another, less reactive metal.

Magnesium-aluminum alloy castings generally contain less aluminum than is required to form the beta phase, based on the compound $Mg_{17}Al_{12}$, under equilibrium cooling conditions. However, beta phase is frequently observed in cast commercial magnesium alloys such as AM50 with a nominal composition of 4.4-5.4 weight % aluminum, 0.26-0.6 weight % manganese, balance magnesium.

Figure 1:
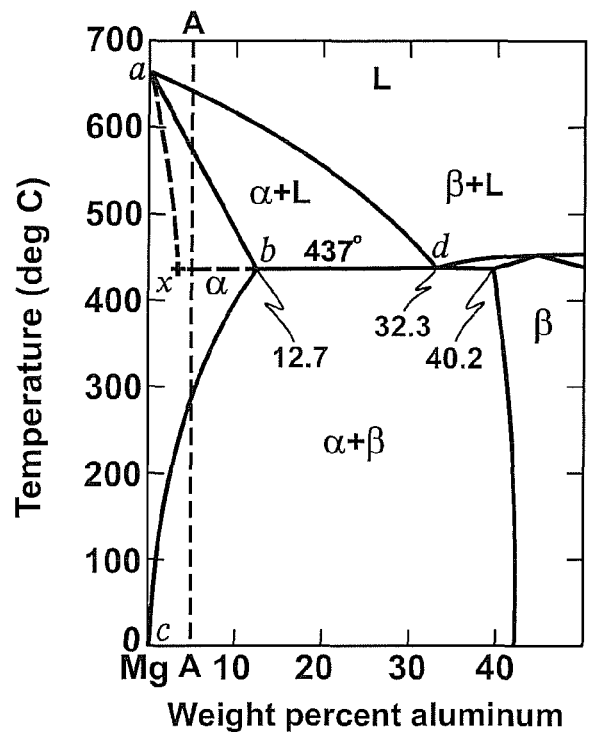
FIG. 1 shows the magnesium-rich region of the magnesium-aluminum phase diagram, showing equilibrium phase boundaries ab, bc and ad and a schematic representation of the non-equilibrium phase boundary ax which obtains under rapid cooling.

This behavior may best be understood by referring to the magnesium-aluminum binary equilibrium phase diagram shown in FIG. 1. The behavior of commercial magnesium alloy, AM50, is well approximated by this diagram due to the low concentration of manganese and impurities.

Inspection of FIG. 1 indicates that under equilibrium cooling conditions, that is responsive to phase boundaries indicated as lines ab and bc in FIG. 1, a magnesium alloy containing about 5 percent by weight of aluminum, indicated as line AA, should precipitate as a single phase alpha magnesium-rich solid solution from the melt, becoming completely solid at about 570° C. On further cooling to below about 300° C. it will begin to precipitate (beta)-phase, an intermetallic compound based on $Mg_{17}Al_{12}$.

But, it is well known that, except for special situations such as a eutectic composition, the average composition of the first-formed solid precipitated from a liquid metal alloy will differ from the composition of the liquid from which it formed. This behavior promotes leading to a phenomenon known as microsegregation which results in coring.

Microsegregation, or coring, during solidification in an alloy casting, results from the composition difference between the solid formed and the liquid from which it forms. Coring is also a consequence of the inability of the solid to maintain a uniform composition during cooling due to the relative slowness of atom migration, or diffusion, in solids.

These phenomena cooperate to ensure that the average composition of the solid under rapid cooling will be described by a line ax which lies to the magnesium-rich side of equilibrium line ab. It will be appreciated that the precise trajectory of line ax results from the alloy behavior under a particular cooling rate and that a family of lines ax will exist, each of which may be uniquely associated with a specific cooling rate.

For the generally Mg-5wt % Al alloy indicated at AA, solidification under non-equilibrium conditions will lead the average solid composition to follow non-equilibrium solidus line ax and the liquid composition to follow non-equilibrium liquidus line ad. Eventually the aluminum concentration in the last remaining liquid reaches the eutectic composition of about 32% Al and this last remaining liquid then solidifies to form alpha and beta phase solids. Because the beta phase forms from the last remaining liquid to solidify, it is located on the boundaries between adjacent alpha grains. In sufficient volume fraction, promoted for example by higher aluminum contents or by more rapid cooling rates, the beta phase may form a near-continuous shell surrounding the alpha grains.

The greater the cooling rate, the more lines ab and ax diverge, and, for a given alloy the greater the proportion of beta phase formed. The quantity of beta phase formed will also depend on the aluminum content of the alloy. Under constant cooling rate, high aluminum content magnesium alloys will develop greater quantities of beta phase than low aluminum content magnesium alloys.

So, for each different magnesium alloy of differing aluminum content, there will exist a different critical cooling rate at which sufficient beta phase forms to substantially completely surround the alpha (phase) grains. In turn the cooling rate will depend on the casting process with a sand cast article generally cooling more slowly that a similar article which has been die cast.

Figure 2:
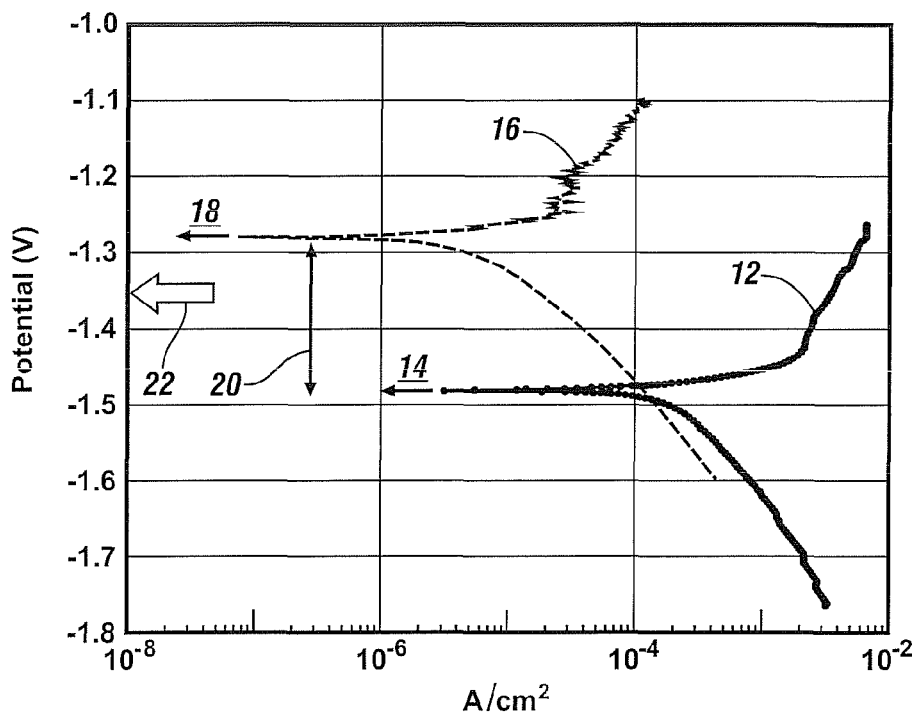
FIG. 2 shows potentiodynamic polarization plots of current density versus electrochemical potential for magnesium-rich alpha phase (curve 12) and aluminum-based beta phase (curve 16).

This sensitivity of microstructure to the casting process in aluminum-containing magnesium alloys may be exploited in further process steps to enable improved corrosion resistance of such aluminum-containing magnesium alloys. FIG. 2 shows a potentiodynamic polarization plots for both substantially pure magnesium or alpha phase (curve 12) and substantially pure $Mg_{17}Al_{12}$ or beta phase (curve 16). Current is plotted, on a logarithmic scale, against potential (relative to a saturated calomel electrode). The corrosion potentials of each phase are indicated by the arrows 14 (alpha phase) and 18 (beta phase) respectively. It is clear that the corrosion potential of the alpha phase is more negative than the corrosion potential of beta phase. Also, the corrosion current per unit area of the alpha phase is almost two orders of magnitude greater than the corrosion current per unit area of the beta phase. Thus a magnesium alloy with a surface of beta phase will be more corrosion-resistant than a similar alloy with a surface of alpha phase.

Figure 3:
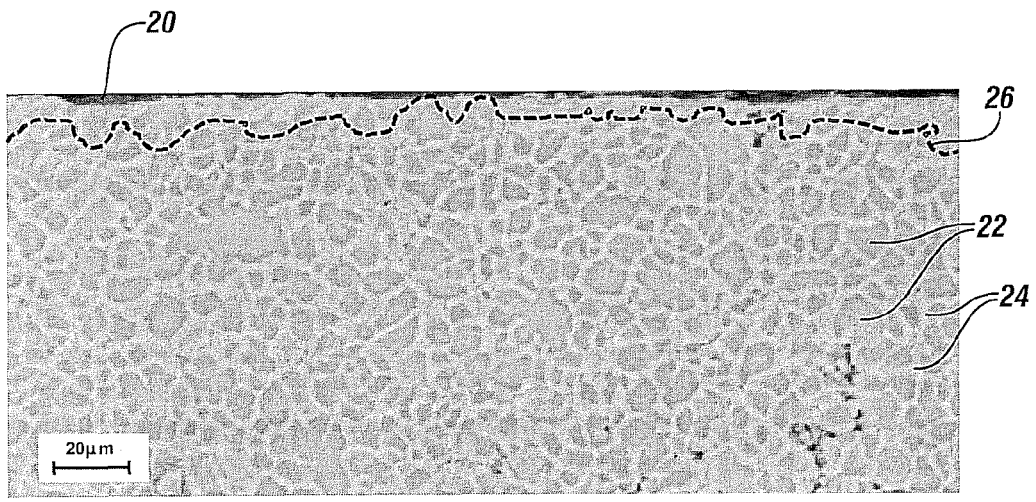
FIG. 3 shows a back-scattered electron micrograph taken using a scanning electron microscope of a cross-section of a die cast AM 50 alloy extending from the as-cast surface into the interior of the casting.

The surface of an as-cast alloy will consist of both alpha phase and beta phase. If the alloy composition and cooling conditions are selected appropriately the magnesium-rich alpha phase will be present as grains separated by a near-continuous layer of beta phase located at the alpha phase grain boundaries. This is illustrated in FIG. 3 which shows an image of cross-section, extending from the surface 20 to the interior of an AM50 alloy casting. The image was taken using a scanning electron microscope using a back scattered electron detector. Such a detector is sensitive to the atomic number of the atoms in the sample; the higher the atomic number, the brighter the image. FIG. 3 shows the darker, magnesium-rich alpha grains 22 outlined, by the lighter aluminum-based beta phase 24. The magnesium-rich alpha grains are generally equiaxed and may be characterized by a grain size corresponding to the longest length of line lying within the bounds of the largest grain.

Figure 4:
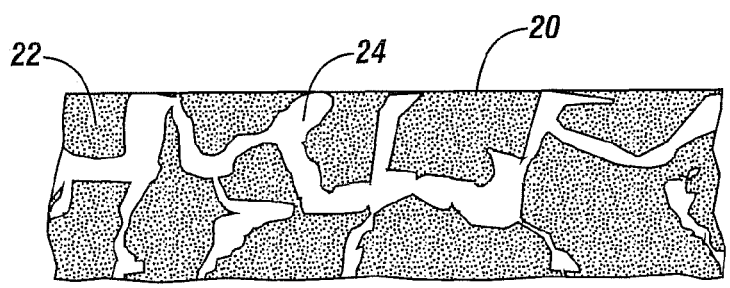
FIG. 4 shows a fragmentary schematic representation of the surface of the AM50 alloy die casting cross-section of FIG. 3 and depicts a layer of alpha phase grains in cross-section, generally bounded by the beta phase which is segregated at the grain boundary.

A schematic representation of the surface layer of alpha grains and their associated segregated beta phase boundary at the surface is shown in FIG. 4. This clearly demonstrates the substantially continuous network of beta phase enveloping the grains of alpha phase in the microstructure of AM50 alloy casting.

Figure 5:
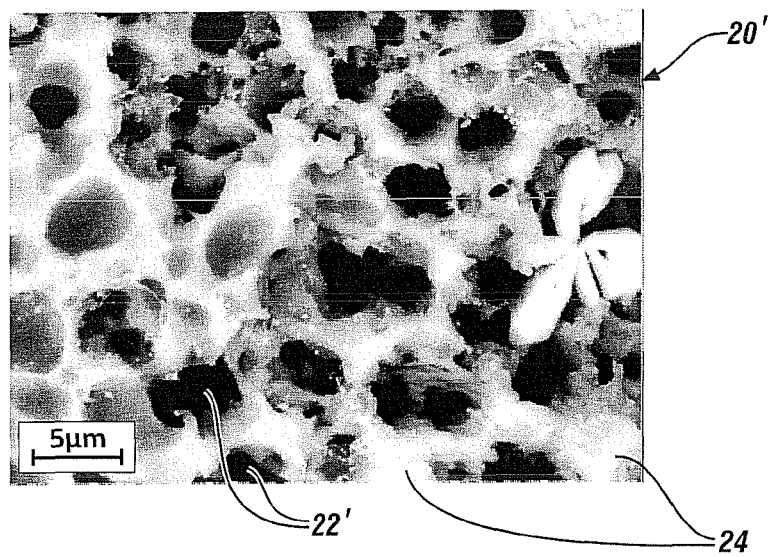
FIG. 5 shows a secondary electron micrograph taken using a scanning electron microscope of the surface of the die cast AM50 alloy of FIG. 3 after being reacted with a 1.6 weight percent NaCl aqueous solution for 3 days at room temperature exposure.

As shown in FIG. 3, the as-cast surface 20 comprises alpha grains. If reacted, for example in a chemically active medium, these alpha grains will preferentially react or corrode to leave behind a pitted surface formed of the remnant, more corrosion-resistant beta phase. An example of the surface 20' of such a reacted, die cast AM 50 sample is shown in FIG. 5, after the casting has been exposed to a 1.6 weight percent NaCl aqueous solution at room temperature, or about 25° C., for 3 days. FIG. 5 has also been taken using a scanning electron microscope but using a secondary electron detector which is sensitive to surface topography. The dark cavities 22' remaining after exposure to the NaCl solution correspond to the locations of the preferentially-reacting alpha grains which have been removed through reaction with the NaCl solution. The bright, beta phase network 24 is the framework which surrounded and outlined the alpha grains.

In FIG. 3, a surface, like that of surface 20' of FIG. 5, is shown in section by dashed line 26 which traces the outline of the near-surface, continuous beta phase 24 below as-cast surface 20. Because dashed line 26 follows the outline of the continuous beta phase 24 it de-emphasizes the influence of those beta phase structures which intersect the as-cast surface 20 and tends to show a less rugged topography than shown in FIG. 5. Nevertheless, it may be appreciated that after only a relatively small material loss from surface 20 of perhaps one or two grain diameters, or in the case shown, about 20 micrometers, due to reaction with a suitable chemically-active species, a 'skin' of more corrosion-resistant beta phase 24 may be formed on the reacted surface (20', FIG. 5) of a cast article. More generally, the depth of reaction will be less than about 5 grain diameters and amount to less than 200 micrometers.

The surface shown in FIG. 5 resulted from exposure of the as-cast AM 50 alloy to an aqueous solution of 1.6 weight percent NaCl for 3 days. A more detailed description of the changes in the surface chemistry of the article and their influence on corrosion may be determined from the Electrochemical Impedance Spectroscopy results shown in FIG. 6.

Electrochemical Impedance Spectroscopy or EIS is a technique in which an electrochemical cell, at steady-state, is perturbed by a small sinusoidal potential, generally of 10 millivolts or less, of varying frequency. To generate the data of FIG. 6 the perturbing sinusoidal potential was 10 millivolts and a frequency range of from about 100 kHz to 10 mHz was used. The electrochemical cell may be viewed as an electrical circuit which will respond to the EIS perturbation as would a circuit constructed of conventional circuit elements such as resistors and capacitors. Thus the results of the EIS frequency scan may be used to develop an equivalent circuit for the cell which may provide insight into the electrochemical processes occurring in the cell. In one representation of the data, the real ($Z_{real}$) and imaginary ($Z_{im}$) parts of the complex impedance (Z) of the cell may be plotted against one another, as in FIG. 6.

Figure 6:
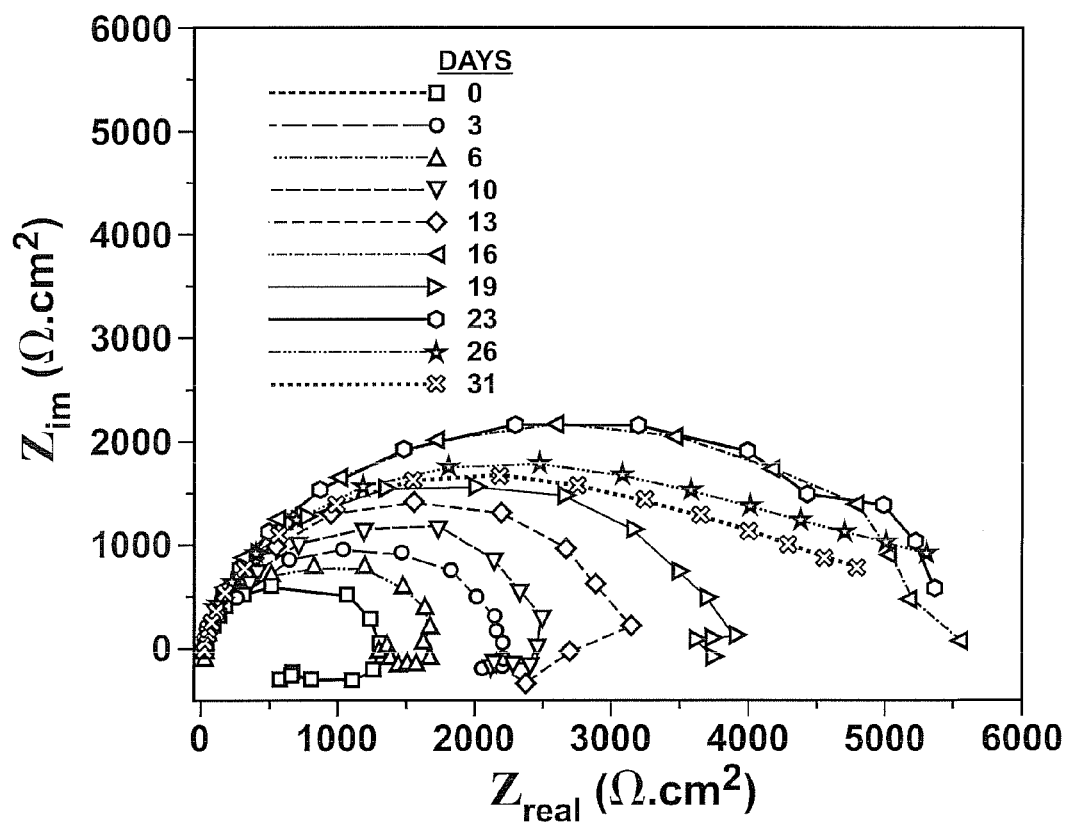
FIG. 6 shows the results of a series of Electrochemical Impedance Spectroscopy (EIS) scans taken at approximately 3 day intervals during room temperature exposure of a die cast AM50 alloy to a 1.6 weight percent NaCl aqueous solution. The data are reported as a Nyquist plot in which the real ($Z_{real}$) and imaginary ($Z_{im}$) parts of the complex impedance (Z) are plotted against one another.

The EIS data of FIG. 6 is taken from a reaction cell in which die cast AM 50 magnesium alloy was exposed to 1.6 weight percent NaCl in water at ambient or room temperature, say about 25° C. EIS data was taken over a period of 31 days at approximately 3 day intervals. Each of the sets of data has the general form of a circular arc. The diameter of the circle which may be fitted to the arc is inversely proportional to the rate of reaction. Hence initially, and at short times of less than 3 days or so, when the surface is preponderantly alpha phase (see FIGS. 3 and 4), the reaction rate is high. As the proportion of beta phase on the surface increases due to the preferential corrosion of alpha phase the reaction rate decreases as indicated by the expanding diameter of the circle which may be fitted to the data arc.

Some oscillatory behavior is noted in the later stages of the corrosion probably resulting from exposure of fresh alpha phase as the encircling beta phase also reacts, though more slowly, but after about 26-31 days a generally stable reaction rate is observed. This long term reaction rate associated with the (reacted) beta phase-enriched surface is significantly less than the reaction rate of the as-cast surface.

In an embodiment of the invention, a more corrosion resistant surface may be developed on a cast magnesium article by selective reaction of the alpha phase by exposure to a 1.6 weight percent aqueous solution of NaCl or the like for a period of between 3 and 30 days. After cleaning to remove any magnesium-rich reaction products remaining on the surface, the reacted article will exhibit a beta phase rich surface with a reduced reaction rate if exposed to aqueous corrosive media.

A suitable chemical cleaning method which preferentially dissolves away the magnesium-rich reaction products from the reacted surface is described in ASTM (Standard)) G1-03, 'Standard Practice for Preparing, Cleaning, and Evaluating Corrosion Test Specimens'. The sample is immersed in a chromic acid based cleaning solution of 20 grams chromic acid, 1 gram silver nitrate and 2 grams barium nitrate dissolved in distilled water to make 100 ml solution. After immersing the sample in the solution for about 10 seconds it may be washed, first in distilled water, and subsequently in ethanol.

In an aspect of this embodiment, selective removal of the magnesium-rich alpha phase may be accomplished more rapidly by an electrochemical procedure which exploits the difference in corrosion potential between the alpha and beta phases shown in FIG. 2. In a suitable electrochemical procedure the workpiece may be immersed in a less reactive aqueous solution of 0.5 N $Na_2SO_4$ with a pH of 6.6. The workpiece is then maintained at a potential in the range of −1.35 to −1.45 volts, preferably about −1.35 volts, relative to a standard calomel electrode for a period of up to 8 hours at room temperature. As may be seen from arrow 22 (FIG. 2) a potential of −1.35 volts is intermediate between the corrosion potential of the alpha phase (about −1.48 volts) and the beta phase (about −1.28 volts). Thus the alpha phase will be selectively attacked and be removed, leaving behind a surface consisting of, preponderantly, the more corrosion-resistant beta phase.

It will be appreciated by those skilled in the art that other salts may be used to accomplish a similar result, including, among others, sodium nitrate, magnesium hydroxide and potassium borate. Also, the rate of reaction may be enhanced by higher salt concentrations, particularly higher concentrations of highly reactive salts like NaCl, or by reducing the pH of the solution. These procedural modifications and adjustments apply with equal effect to both the chemical and electrochemical reaction processes just described. The process is not strongly affected by reaction temperature and near room temperature reaction temperatures of between about 15° C. and 30° C. will promote similar outcomes and reaction rates.

After cleaning the surface of reaction products, yet further enhancement of corrosion performance may be achieved by further treatments or modifications to the surface.

In a second embodiment, the reacted aluminum-enriched surface may be anodized, that is, an electrolytic process may be employed to develop an oxide layer of controlled thickness at the surface. Although the beta phase is enriched in aluminum, it also contains an appreciable magnesium content. It is therefore preferred to employ an anodizing treatment like Plasma Electrolytic Oxidation or PEO which has been demonstrated to form hard, corrosion-inhibiting oxide layers on both magnesium and aluminum.

PEO, also termed micro-arc oxidation, is an electrochemical surface treatment process for generating oxide coatings on metals. It is similar to anodizing in that a component is immersed in a dilute, alkaline, aqueous solution of say, KOH, and is made the anode of an electrical circuit so that it develops an oxide layer. But the voltages used, typically from 200 to 600 volts, are selected to exceed the dielectric strength of the oxide layer. This high voltage produces discharges at the component surface, producing a plasma which sinters and anneals the oxide layer. This process can be used to grow generally pore-free, largely crystalline, oxide coatings on metals such as aluminum and magnesium at rates of up to one micrometer per minute. These coatings are hard, between 700 and 2000 HPV, conferring wear resistance in addition to additional corrosion resistance. Coating thicknesses may range from between 1 and 60 micrometers, but thinner coatings are more typical.

In a third embodiment the reacted surface may be aluminized by deposition of aluminum. Due to the similarity in melting points of magnesium (650° C.) and aluminum (660° C.) hot dip processing is not generally feasible but spray deposition processes in which atomized molten metal droplets are impacted at high velocity against the article may be used. Ion Vapor Deposition of aluminum is also feasible. In this process, a high negative electric potential is applied between the article and an aluminum evaporation source in a vacuum chamber containing argon at a pressure of about $10^{-2}$ Torr. The electric potential ionizes the argon gas in the chamber and creates a glow discharge around the parts so that as the aluminum from the evaporation source passes through the glow discharge it combines with the ionized argon and is transported to the part. As a result a uniform and dense coating of aluminum is plated on the article.

In a fourth embodiment the reacted surface may be painted. The roughened surface and the protruding beta walls will mechanically interfere with the paint film and enhance paint adhesion. The paint film is preferably 100 to 130 micrometers thick. A baked paint finish, as is commonly employed for automotive applications, generally offers superior performance than cold cured paint formulations.

Automotive paint generally comprises a plurality of coating layers which may be applied by dipping in a bath, or as powder or as a liquid spray. Commonly though, the first coating applied is a phosphate coating applied by dipping an assembled vehicle body in a bath containing zinc phosphate and other chemicals. Such bath chemistries are compatible with steel or aluminum alloys but not magnesium. But the development of the aluminum rich surface on the magnesium article may render the magnesium aluminum article compatible with phosphate systems in common use. Alternatively the anodized or aluminized surfaces developed in the prior embodiments would render the magnesium article suitable for immersion in conventional phosphate baths.

The continuity of the aluminum-enriched surface may depend on both the average aluminum content of the alloy and on the rate of cooling, which will influence the degree of coring which occurs on solidification. For example a continuous aluminum-enriched surface layer may be developed in alloys with aluminum contents of about 8-9 weight percent, such as AZ80 and AZ91 when sand cast, a process which promotes relatively slow cooling. A similarly continuous layer might develop in 5-6 weight percent aluminum alloys such as AM50 and AM60 when high pressure die cast, a process well known to promote rapid cooling.

The practice of the invention has been illustrated through reference to certain preferred embodiments that are intended to be exemplary and not limiting. The full scope of the invention is to be defined and limited only by the following claims.

The invention claimed is:

1. A method of improving the corrosion resistance of a cast article formed by solidification of a magnesium alloy with an overall composition comprising at least 85 percent by weight of magnesium and at least about 5 percent by weight of aluminum, the cast article having an as-cast surface and a microstructure comprising grains with a grain size, the grains being magnesium rich and having a magnesium content greater than the overall alloy magnesium content, the grains being separated by a near-continuous layer of grain boundary material, generally enclosing the grains, the material having an aluminum content greater than the overall alloy aluminum content, the method comprising:
    treating the surface of the article with an aqueous solution comprising a salt, the aqueous salt solution being suitable for preferential reaction with the magnesium-rich grains of the article surface to form removable magnesium-containing reaction products extending inwardly from the as-cast article surface to a reaction depth of between 1 and 5 times the grain size; and
    removing the magnesium-containing reaction products to expose cavities from removed magnesium material, the cavities being bounded with residual aluminum-enriched grain boundary material.

2. The method of improving the corrosion resistance of a cast magnesium alloy article as set forth in claim 1, further comprising anodizing the residual aluminum-enriched grain boundary material to form an anodized layer.

3. The method of improving the corrosion resistance of a cast magnesium alloy article as set forth in claim 2 wherein the anodized layer has a thickness of between 1 and 60 micrometers.

4. The method of improving the corrosion resistance of a cast magnesium alloy article as set forth in claim 1, further comprising aluminizing the residual aluminum-enriched grain boundary material to form an aluminized layer.

5. The method of improving the corrosion resistance of a cast magnesium alloy article as set forth in claim 4 wherein the aluminized coating is applied by spray deposition.

6. The method of improving the corrosion resistance of a cast magnesium alloy article as set forth in claim 4 wherein the aluminized coating is applied by vapor deposition.

7. The method of improving the corrosion resistance of a cast magnesium alloy article as set forth in claim 1, further comprising phosphating and painting the residual aluminum-enriched grain boundary material.

8. The method of improving the corrosion resistance of a cast magnesium alloy article as set forth in claim 1 wherein the article surface is reacted with the aqueous salt solution at a temperature of between 15° C. and 30° C.

9. The method of improving the corrosion resistance of a cast magnesium alloy article as set forth in claim 8 wherein the salt is NaCl.

10. The method of improving the corrosion resistance of a cast magnesium alloy article as set forth in claim 8 wherein the salt is one of the group consisting of sodium nitrate, magnesium hydroxide and potassium borate.

11. The method of improving the corrosion resistance of a cast magnesium alloy article as set forth in claim 1 wherein the as-cast surface is electrochemically reacted with a substantially neutral pH, aqueous solution comprising a salt at an imposed potential of between −1.35 to −1.45 volts relative to a saturated calomel electrode.

12. The method of improving the corrosion resistance of a cast magnesium alloy article as set forth in claim 11 wherein the pH is 6.6 and the salt is $Na_2SO_4$.

13. The method of improving the corrosion resistance of a cast magnesium alloy article as set forth in claim 1 wherein the alloy is AM 50 or AM60 and the article is die cast.

14. The method of improving the corrosion resistance of a cast magnesium alloy article as set forth in claim 1 wherein the alloy is AZ 91 or AZ80 and the article is die cast or sand cast.

15. A method of improving the corrosion resistance of a cast article formed by solidification of a magnesium alloy with an overall composition comprising at least 85 percent by weight of magnesium and at least about 5 percent by weight of aluminum, the cast article having an as-cast surface and a microstructure comprising grains with a grain size, the grains having a magnesium content greater than the overall alloy magnesium content, the grains being separated by a near-continuous layer of grain boundary material, generally enclosing the grains, the material having an aluminum content greater than the overall alloy aluminum content, the method comprising:
    treating the surface of the article by electrochemically reacting the as-cast surface with a substantially neutral pH, aqueous salt solution comprising a salt at an imposed potential of between −1.35 to −1.45 volts relative to a saturated calomel electrode for preferential reaction with the magnesium-rich grains of the article surface to form removable magnesium-containing reaction products; and
    removing the magnesium-containing reaction products to expose cavities from removed magnesium material, the cavities being bounded with residual aluminum-enriched grain boundary material.

16. The method of improving the corrosion resistance of a cast magnesium alloy article as set forth in claim 15 wherein the pH is 6.6 and the salt is $Na_2SO_4$.

17. The method of improving the corrosion resistance of a cast magnesium alloy article as set forth in claim 15, further comprising anodizing the residual aluminum-enriched grain boundary material to form an anodized layer.

18. The method of improving the corrosion resistance of a cast magnesium alloy article as set forth in claim 17 wherein the anodized layer has a thickness of between 1 and 60 micrometers.

19. The method of improving the corrosion resistance of a cast magnesium alloy article as set forth in claim 15, further comprising aluminizing the residual aluminum-enriched grain boundary material to form an aluminized layer.

20. The method of improving the corrosion resistance of a cast magnesium alloy article as set forth in claim 15, further comprising phosphating and painting the residual aluminum-enriched grain boundary material.

* * * * *